United States Patent
Jeon et al.

[11] Patent Number: 6,088,257
[45] Date of Patent: Jul. 11, 2000

[54] FERROELECTRIC RANDOM ACCESS MEMORY DEVICE AND METHOD FOR OPERATING THE SAME

[75] Inventors: Byung-Gil Jeon; Yeon-Bae Chung, both of Kyunggi-do, Rep. of Korea

[73] Assignee: Samsung Electronics, Co., Ltd., Suwon, Rep. of Korea

[21] Appl. No.: 09/006,289

[22] Filed: Jan. 13, 1998

[30] Foreign Application Priority Data

Jan. 13, 1997 [KR] Rep. of Korea ............................ 97-671

[51] Int. Cl.$^7$ ................................................. G11C 11/22
[52] U.S. Cl. .......................... 365/145; 365/149; 365/210
[58] Field of Search ................................ 365/145, 149, 365/210

[56] References Cited

U.S. PATENT DOCUMENTS

| | | | |
|---|---|---|---|
| 5,307,304 | 4/1994 | Saito et al. | 365/145 |
| 5,487,030 | 1/1996 | Drab et al. | 365/145 |
| 5,822,240 | 10/1998 | Yoo | 365/145 |

*Primary Examiner*—David Nelms
*Assistant Examiner*—Hien Nguyen
*Attorney, Agent, or Firm*—Marger Johnson & McCollom, P.C.

[57] ABSTRACT

Disclosed is a ferroelectric random access memory having increased endurance and educed power consumption. The ferroelectric random access memory device comprises a bit line precharge circuit for precharging each of the bit lines to a first voltage level, a pulse supply circuit for supplying a first voltage pulse signal to a first electrode of the ferroelectric capacitor corresponding to a selected one of the memory cells for allowing the ferroelectric capacitor to polarize in a predetermined direction, and a drive signal generation circuit for generating two complementary drive signals which vary from a first voltage level to a second voltage level. The ferroelectric random access memory device further includes a comparator circuit for comparing a respective bit line voltage level with a reference voltage level and providing two complementary drive signals to the bit line responsive to the comparison reference voltage and a reference voltage generating circuit for generating the reference voltages supplied to the bit lines in accordance with the voltage levels of the corresponding word lines.

10 Claims, 8 Drawing Sheets

FERROELECTRIC RANDOM ACCESS MEMORY DEVICE AND METHOD FOR OPERATING THE SAME

FIELD OF THE INVENTION

The present invention relates to memory devices and, more particularly, to a ferroelectric random access memory device with ferroelectric memory cells and a method for operating the same.

BACKGROUND OF THE INVENTION

Memory system architectures are currently designed combining a variety of memory devices such as semiconductor memory devices (e.g., dynamic RAM, static RAM, flash memory), magnetic discs, and the like. This means that it is very difficult to support all memory spaces of, for example, a personal computer, by using only one type of memory device.

In the field of semiconductor memory devices, the improvements in device density, high-speed read/write operation, access time, low power consumption, etc. have long since been required but have faced inevitable technology limitations.

One solution to such limitations has been the development of ferroelectric memory devices. Ferroelectric memory devices which retain data even when powered off, have been realized through the use of a ferroelectric material such as lead zirconate titanate (PZT). PZT has desirable characteristics including the ability to exhibit hysteresis. Several examples of ferroelectric memory techniques have been disclosed in several published articles. One such published article appeared in the IEEE Journal of Solid-State Circuits, vol. 23, No. 5, pp. 1171~1175, October 1988, and is entitled "An Experimental 512-bit Nonvolatile Memory with Ferroelectric Storage Cell." Another article appeared in Electronics, pp. 32, Feb. 4, 1998 and is entitled "New Challenger: The Ferroelectric Ram." Both of the above-mentioned published articles are incorporated herein by reference.

As is well known in this art, ferroelectric material has spontaneous polarization characteristics. The direction of the polarization is controlled by the direction of an electric field. Typical ferroelectric materials include the $ABO_3$ type of the $PbZrO_3$ molecule. A metal atom, i.e., zirconium (Zr) which is positioned at the center of the $PbZrO_3$ molecule has two stable state points according to the polarization direction of the applied electric field. Thus, the ferroelectric material exhibits hysteresis characteristics.

Ferroelectric Random Access Memory (FRAM) devices take advantage of the hysteresis characteristics of the ferroelectric material. FRAMs have non-volatile memory storage characteristics by corresponding the degree of polarization to binary data. FRAMs are capable of performing very fast read/write operations by taking advantage of the very fast inversing speed of polarization.

A ferroelectric memory cell will be described hereinafter based on the above-mentioned published articles. FIG. 1 shows the circuit of a ferroelectric memory cell. The ferroelectric memory cell consists of a charge transfer transistor $T_F$ and a ferroelectric capacitor $C_F$. The ferroelectric memory cell shown in FIG. 1 is suitable for large scale capacity memory devices. In each ferroelectric memory cell, the capacitor $C_F$ has a ferroelectric material inserted between both electrodes. One of the two electrodes, i.e., one plate electrode, is set to a predetermined middle voltage between the two voltages corresponding to a logic "1" and a logic "0." The charge transfer transistor $T_F$ includes a channel and a gate. The channel of the charge transfer transistor $T_F$ is connected between the other electrodes of the two electrodes of the capacitor $C_F$ and the bit line BL. The gate of the charge transfer transistor $T_F$ is connected to the word line WL. The charge transfer transistors included in the FRAM are fabricated using well-known CMOS fabrication techniques.

FIG. 2 is a graph of the hysteresis I-V switching loop of the prior art ferroelectric capacitor. In this graph, the abscissa indicates the potential difference between the electrodes of the ferroelectric capacitor, i.e., the voltage between both ends of the capacitor. The ordinate of the graph indicates the amount of charge induced in the surface of ferroelectric material according to the spontaneous polarization, i.e., degree of polarization in micro-coulombs per centimeter squared ($\mu C/cm^2$).

As shown in FIG. 2, if no electric field is applied to the ferroelectric material with a zero voltage applied thereto, polarization does not occur. When a voltage is increased in the positive direction of the graph, the degree of polarization is increased from zero up to a point "A" inside the positive charge polarization domain. At the point "A", all the domains are polarized in one direction and the degree of polarization is maximized. In this case, the degree of polarization, i.e., the amount of charge contained in the ferroelectric material is equal to Qs and the applied voltage is equal to the power supply voltage Vcc. Once at point A, even if the voltage is lowered again to zero volts, the degree of polarization is not reduced to zero, but remains at a point "B". The amount of charge in the ferroelectric material, i.e., the remaining degree of polarization is equal to Qr.

Next, if the voltage is increased in a negative direction of the graph, the degree of polarization is changed from the point "B" to a point "C" inside the negative charge polarization domain, as shown by curve 21 of FIG. 2. At point "C", all domains of the ferroelectric material are polarized in a reversed direction with respect to the polarization direction at the point "A". The degree of polarization is then equal to -Qs and the applied voltage is equal to the power supply voltage -Vcc. Once at point C, even if the voltage is lowered again to zero volts, the degree of polarization is not reduced to zero, but remains at a point "D". The remaining degree of polarization is equal to -Qr. If the voltage is increased once more in the positive direction, the degree of polarization is changed from the point "D" to the point "A".

Thus, if a voltage causing an electric field is applied to the ferroelectric capacitor which includes a ferroelectric material inserted between the two electrodes, even though the electrodes are set to a floating state, the polarization direction according to the spontaneous polarization can be continuously maintained. Because of the spontaneous polarization, the surface charges of the ferroelectric material are not spontaneously dissipated due to leakage. If the voltage is not applied to change the degree of polarization to zero, the polarization direction continues to be maintained.

Read and write operations of the FRAM can be carried out by polarization reversion. The speed of the read and write operations are determined by the time it takes to reverse the polarization of the FRAM cell. The speed of polarization reversion of the ferroelectric capacitor is determined by a variety of factors including the capacitor area, the thickness of ferroelectric thin film, and the applied voltage. The unit of the speed of polarization reversion is typically microseconds ($\mu s$). Thus, FRAM devices operate faster than electrically erasable and programmable read only memory (EEPROM) devices or flash memory devices.

The read and write operation of the prior art FRAM functions as follows. A binary data signal corresponds to points "B" and "D" of the hysteresis loop shown in FIG. 2. Logical "1" corresponds to point "B" and logical "0" corresponds to point "D". Turning again to FIG. 1, at an initial stage of the read and write operation of the FRAM, data stored in memory cells is sensed by a sensing circuit. During the sensing operation, a zero voltage or ground voltage Vss is applied to the selected bit line BL. The charge transfer transistor $T_F$ is then turned on by the selected word line WL so that zero voltage on the bit line BL is applied to one electrode of the ferroelectric capacitor $C_F$ and a pulse of power supply Vcc is applied to the other electrode thereof. At this time, if logic "1" data is stored in the capacitor $C_F$, the degree of polarization of the capacitor $C_F$ is varied from the point "B" to the point "D" via the point "C". As a result, a charge dQ is transmitted from the capacitor $C_F$ to the bit line BL increasing the voltage on the bit line BL.

Conversely, if logic "0" data is stored in the capacitor $C_F$, the degree of polarization of the capacitor $C_F$ is varied from point "D" to point "C" and returns to point "D". In this case, the voltage on the bit line BL is not changed. The bit line voltage is compared with a reference voltage REF by means of a well-known sensing circuit (not shown). If the bit line voltage is more than the reference voltage REF, it is increased up to an operational voltage level i.e., the power supply Vcc level. If the bit line voltage is less than the reference voltage REF, the bit line voltage is lowered again to zero or ground voltage Vss.

The data write or read operation of the prior art FRAM begins after the completion of the data sensing operation. During the write operation, the voltage on the data line is delivered to the bit line BL by means of a well-known column decoder (not shown). After lapse of a predetermined time, a pulse is applied to the ferroelectric capacitor $C_F$. The degree of polarization of the ferroelectric capacitor $C_F$ is moved from the point "B" to the point "D" so that the logic "1" or "0" data is written in to the memory cell.

If such a sensing operation is carried out once with respect to the cell which stores logic "1" data (the degree of polarization of Qr is at the point "B") or if a pulse is applied once to the ferroelectric capacitor $C_F$ which stores logic "1" data, the stored data is changed into logic "0" data (the degree of polarization of -Qr at the point "D") because of the hysteresis characteristics of the ferroelectric capacitor $C_F$. Therefore, before the completion of the write operation, it is necessary to allow for the recovery of the ferroelectric capacitor $C_F$ of the non-selected memory cell to an initial state. This data recovery is called "rewrite" or "restore". The power supply voltage Vcc of the pulse is applied once more to the ferroelectric capacitor $C_F$ of the memory cell whose sensing operation is completed. Thus, the degree of polarization of the ferroelectric capacitor $C_F$ of the non-selected memory cell is recovered from -Qr (logic "0" ) at point "D" to Qr (logic "1") at point "B".

Next, during the read operation of the FRAM, data on the bit line BL obtained by the data sensing operation is directly delivered to external circuitry. Even during the read operation, if the sensing operation is carried out once with respect to the cell which stores logic "1" data, the data stored in the ferroelectric capacitor $C_F$ is changed into logic "0" data Therefore, before the completion of the read operation, the power supply voltage Vcc of the pulse is applied once more to the ferroelectric capacitor $C_F$ of the memory cell whose sensing operation is completed. Thus, the degree of polarization of the ferroelectric capacitor $C_F$ read is recovered from -Qr to Qr at point "B".

In the prior art FRAM having the above-described structure, the "domain switching" phenomenon causes the polarization of the ferroelectric capacitor to change during one write/read cycle. Where the write/read cycle is repeated, the permanent degree of polarization of ferroelectric material is reduced due to fatigue. Fatigue reduces the endurance of FRAMs. Also, since the cell data sensed during the sensing operation is amplified to an operational power supply voltage Vcc, a voltage higher than the operational power supply voltage Vcc must be supplied to the word line in order to maintain proper operation. Thus, the prior art FRAM requires an additional booster circuit which increases the device's power consumption.

Accordingly, a need remains for a FRAM with improved endurance and lower power consumption.

SUMMARY OF THE INVENTION

It is an object of the present invention to overcome the problems associated with prior art FRAMs.

It is another object of the invention to provide a FRAM with improved endurance and a method for operating the same.

It is yet another object of the present invention to provide a FRAM having low power consumption.

According to an aspect of the present invention, a ferroelectric random access memory device comprises a substrate defined by a plurality of rows and columns, a plurality of word lines extending along the plurality of rows, a plurality of plate lines extending along the plurality of rows, and a plurality of bit lines extending along the plurality of columns. The memory device also includes a memory cell array having a plurality of memory cells is arranged in a matrix form, each memory cell including a switch having a first, a second, and a control terminal and a capacitor having a first and a second electrode and a ferroelectric material inserted between the first and second electrodes, the first terminal of the switch being connected to a corresponding bit line of the plurality of bit lines, the second terminal of the switch being connected to the first electrode of the capacitor, the control terminal of the switch being connected to a corresponding word line of the plurality of word lines, and the second electrode of the capacitor being connected to a corresponding plate line of the plurality of plate lines. The ferroelectric memory device further comprises means for precharging each of the plurality of bit lines to a predetermined precharge voltage level and means for generating a voltage pulse signal having a first voltage level, the voltage pulse signal being applied to at least one plate line of the plurality of plate lines corresponding to a selected word line of the plurality of word lines thereby polarizing the ferroelectric material in a predetermined direction. Also included in the memory device are means for generating a reference signal having a second voltage level, means for generating a first and a second complementary drive signals, and means for comparing the reference signal to a voltage on a bit line corresponding to the selected word line and for applying the first or second complementary drive signals to the capacitor responsive to the comparison.

A further aspect of the present invention is a method for reading or writing a binary data signal from or into a memory cell, respectively. The memory cell includes a ferroelectric capacitor and a switch, the ferroelectric capacitor having a first and a second electrode and a ferroelectric material inserted between the first and the second electrodes, the first electrode for receiving a plate line, and the switch having a first, a second, and a control terminal, the control terminal for receiving a word line, the first terminal for receiving a bit line, and the second terminal for connecting to the second electrode of the capacitor. The method comprises selecting the memory cell, applying a precharge voltage to the bit line, applying a first voltage pulse to the plate line when the word line is selected thereby polarizing the capacitor, and comparing a bit line voltage with a reference voltage. The method further comprises applying a drive voltage to the capacitor responsive to the comparison, and applying a second voltage pulse to the plate line.

Yet a further aspect of the present invention is a semiconductor memory device comprising a memory cell array having a plurality of memory cells, each of the memory cells including a capacitor having a ferroelectric material inserted between two electrodes for storing a binary data signal, means for supplying a first polarity voltage pulse to the capacitor corresponding to a selected memory cell thereby polarizing the ferroelectric material in a predetermined direction, and means for supplying a second polarity voltage to the capacitor thereby preventing the ferroelectric material from reversing polarization direction. The binary data signal for the semiconductor memory device is stored only in a positive charge polarization domain of the capacitor. Conversely, the binary data signal is stored only in a negative charge polarization domain of the capacitor.

BRIEF DESCRIPTION OF THE DRAWINGS

The above objects, features, and advantages of the present invention will become more apparent by describing in detail the preferred embodiments thereof with reference to the accompanying drawings, in which.

DETAILED DESCRIPTION OF PREFERRED EMBODIMENTS

First Embodiment

A FRAM according to the first embodiment of the present invention stores logic "1" and "0" data in only one charge polarization domain wherein the charge polarity of the ferroelectric capacitor and the polarization direction of the ferroelectric material are not changed.

Figure 1:
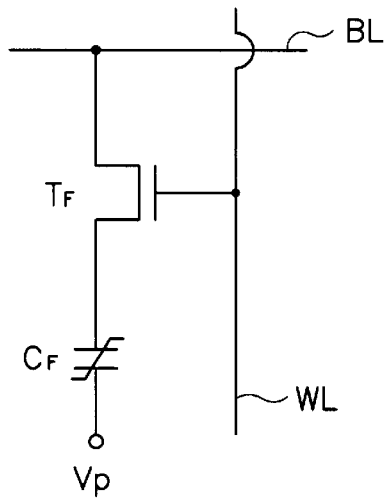
FIG. 1 is a circuit diagram of a ferroelectric memory cell.
Figure 2:
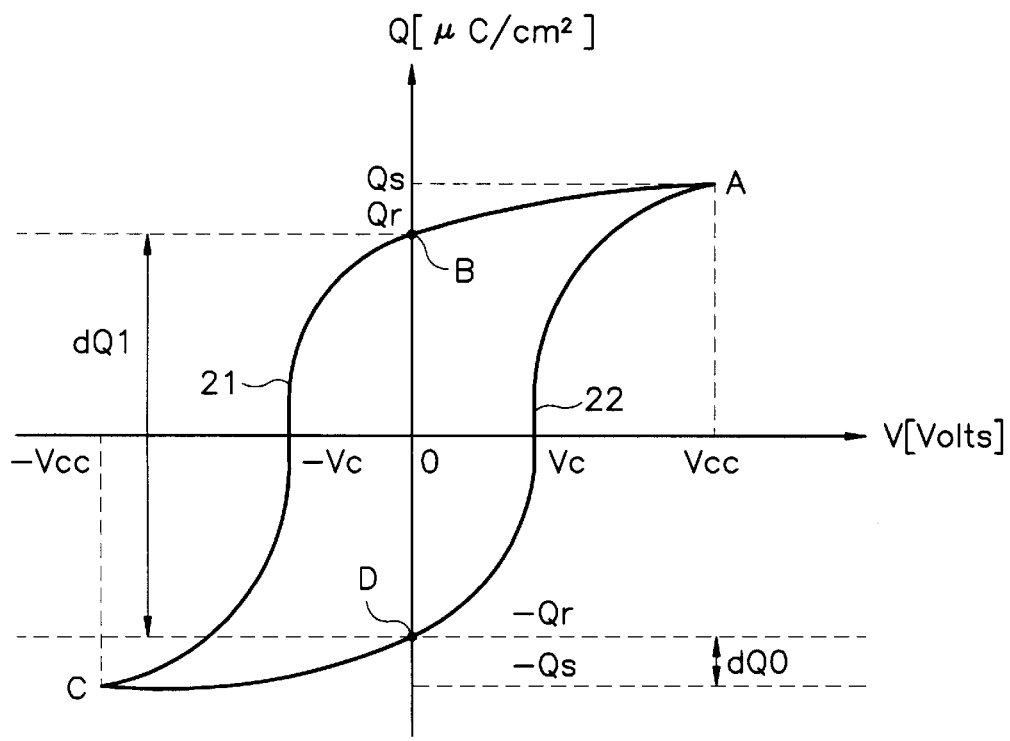
FIG. 2 is a graph of the hysteresis characteristics of a ferroelectric capacitor.
Figure 3:
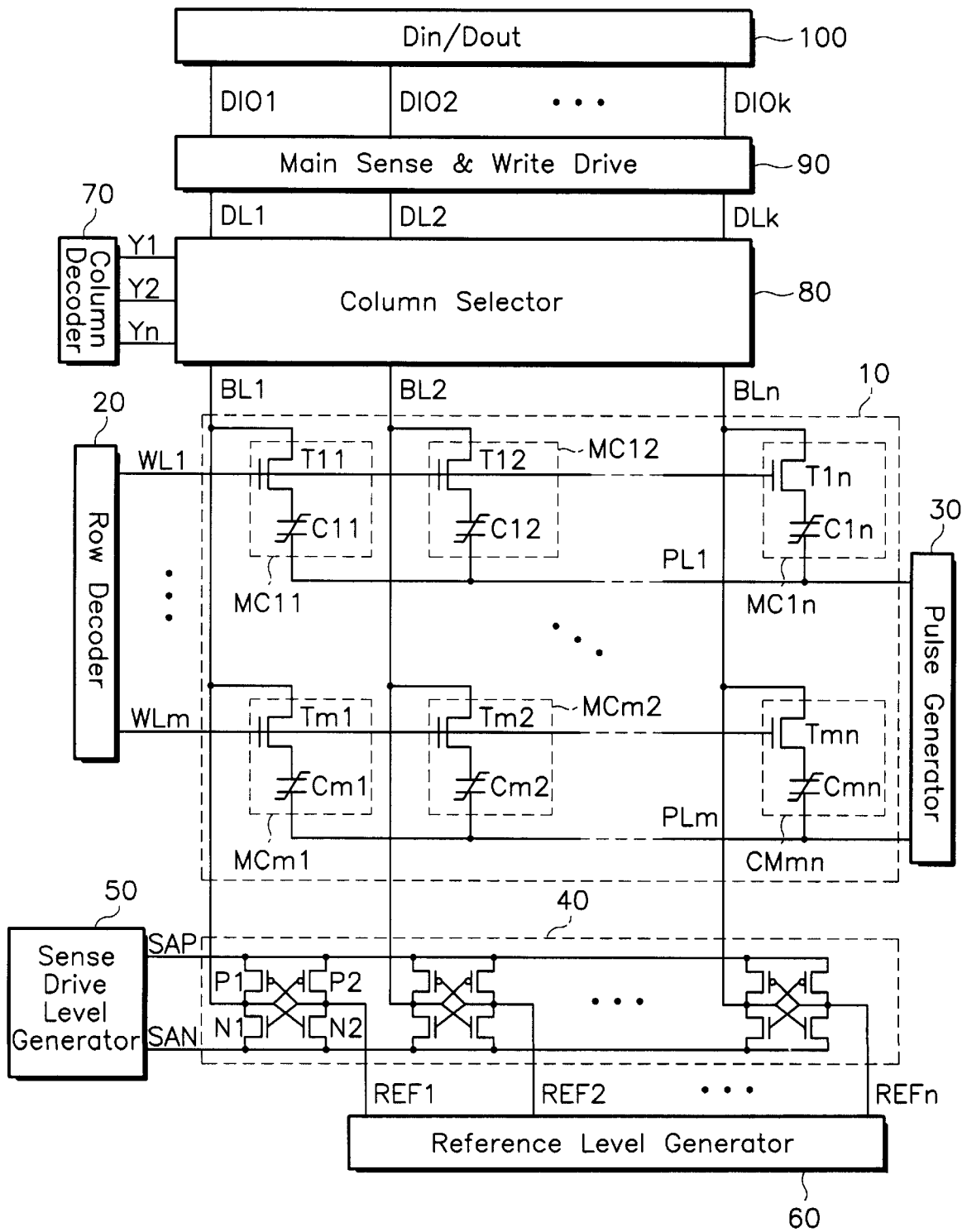
FIG. 3 is a circuit diagram of a FRAM device according to an embodiment of the present invention.
Figure 4:
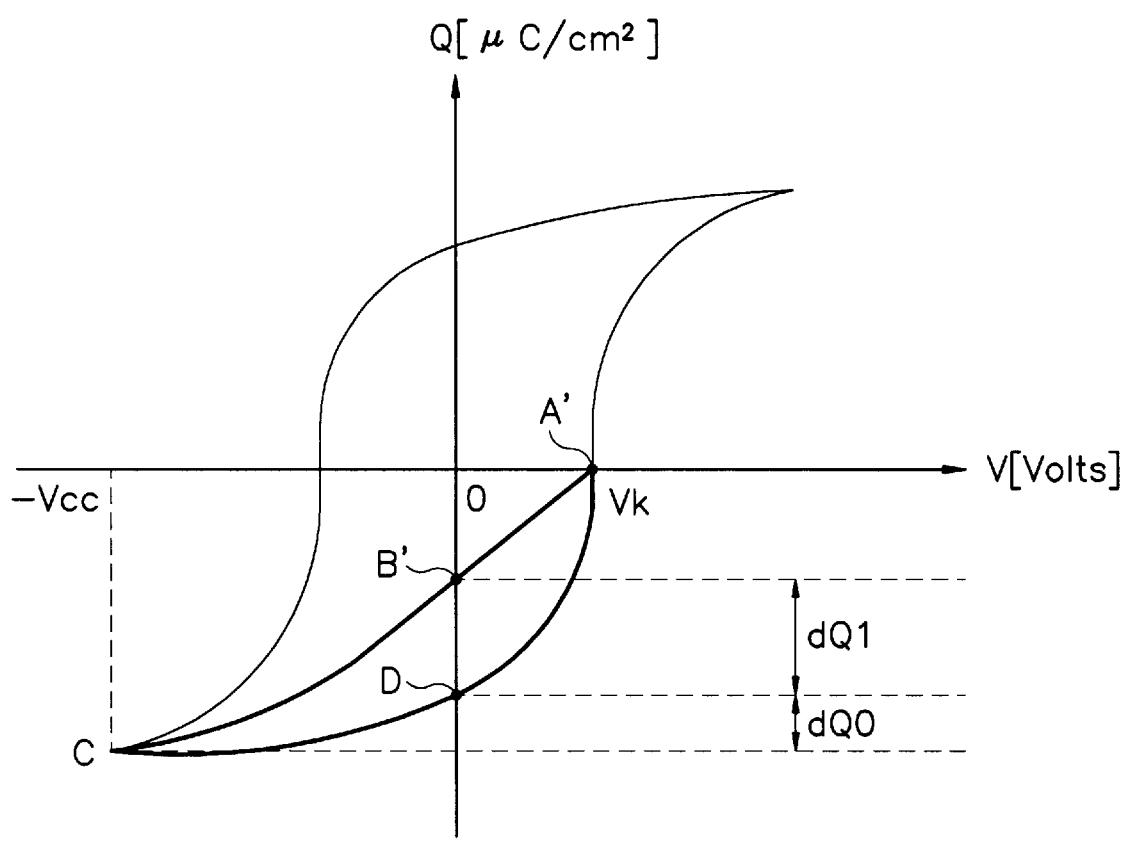
FIG. 4 is a graph of the first hysteresis characteristic of the FRAM shown in FIG. 3.

Referring to FIG. 3, the FRAM comprises a pulse generation circuit 30 and a sense drive level generation circuit 50. The pulse generation circuit 30 generates a power supply voltage Vcc pulse signal, i.e., operational voltage level and the sense drive level generation circuit 50 senses a sense drive signal having a voltage level Vk. As shown in FIG. 4, in the negative charge polarization domain of the hysteresis graph of the ferroelectric capacitor, binary data corresponds to points "B'" and "D". During the write/read operation of the FRAM, therefore, the sense drive signal having a voltage level Vk allows the polarity of charge polarization to remain the same when it is applied from the bit line BLn to the ferroelectric capacitor.

Figure 5:
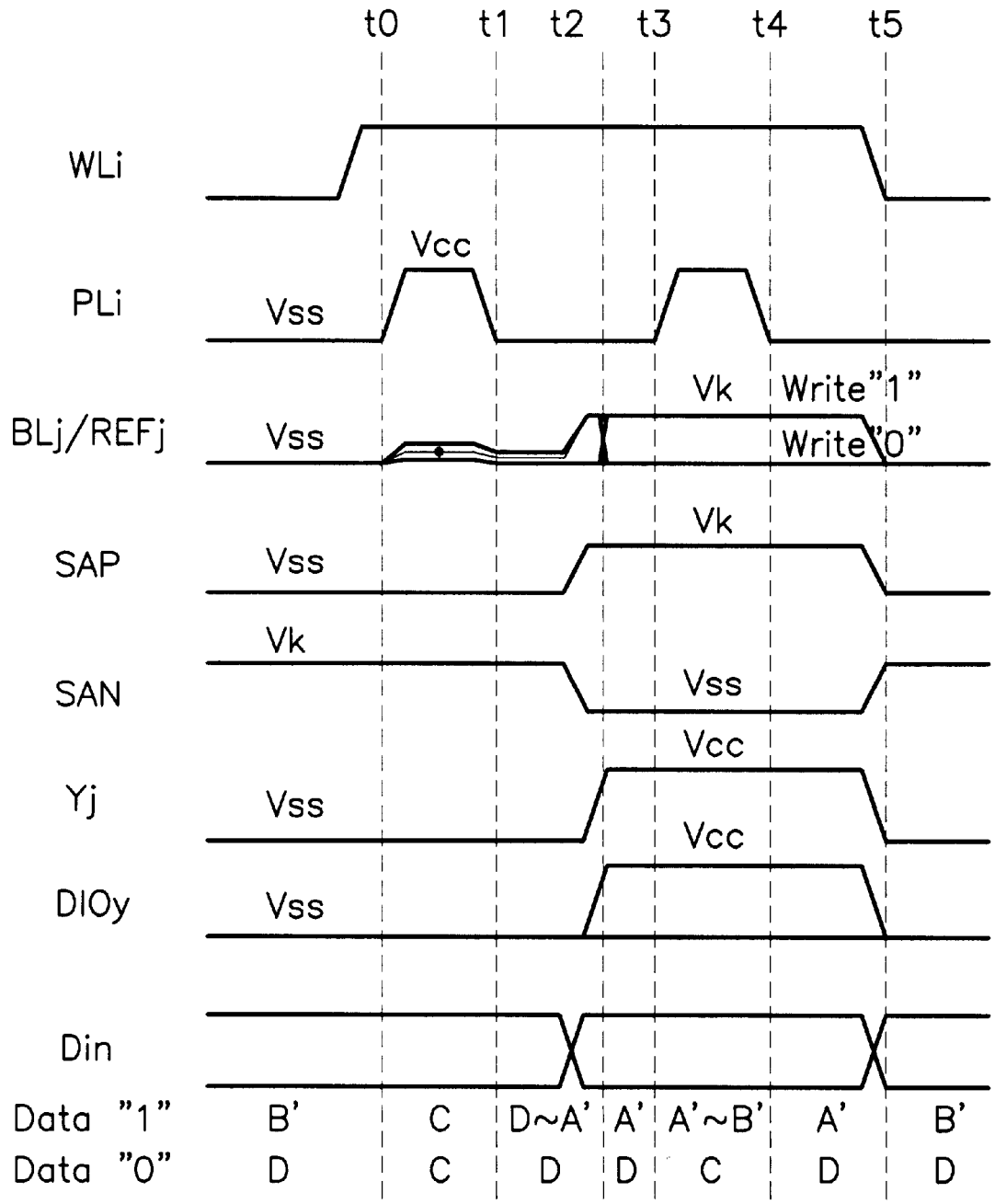
FIG. 5 is a timing diagram of the write operation of the FRAM shown in FIG. 3 having the first hysteresis characteristic shown in FIG. 4.

As shown in FIG. 5, the FRAM of this embodiment allows the pulse signal having an operational voltage level Vcc to be applied to the ferroelectric capacitor via a plate line such that data stored in memory cells is recognized. Thus, data is transmitted from the ferroelectric capacitor to the bit line BLn and then during the time interval t1~t2, the bit line is developed up to a voltage level Vk within the range of non-reversion in the polarization direction of the capacitor. During the write operation of the FRAM, if the power supply voltage level Vcc signal corresponding to logic "1" data is applied to the bit line BLn, the signal is changed to the voltage level Vk signal and then applied to the ferroelectric capacitor.

Since the binary data is stored in the negative charge polarization domain, no domain switching is generated and therefore the endurance of the FRAM is considerably improved. Also, since there is no need for supplying a pumped voltage signal to the word line WLi, the structure of the FRAM is simplified and consumes less power.

Returning to FIG. 3, the FRAM is comprised of a memory cell array 10, a row decoder circuit 20, a pulse generation circuit 30, a latch sense circuit 40, a sense drive level generation circuit 50, a reference level generation circuit 60, a column decoder circuit 70, a column selection circuit 80, a main sense and write drive circuit 90, and a data input/output circuit 100. Although not shown in FIG. 3, the FRAM further comprises a well-known bit line precharge circuit for precharging the bit lines to a predetermined voltage level.

The memory cell array 10 is comprised of a plurality of word lines WL1~WLm and a plurality of plate lines PL1~PLm arranged in m rows, and a plurality of bit lines BL1~BLn arranged in n columns. The memory cell array 10 further comprises a matrix of m×n ferroelectric memory cells MC11~MCmn formed at the cross points of the word lines WL1~WLm and the bit lines BL1~BLn.

Each memory cell is comprised of a charge transfer transistor Tij and a ferroelectric capacitor Cij, where i indicates an integer from 1 to m and j denotes an integer from 1 to n. Between both electrodes of each of the capacitors Cij, a ferroelectric material is inserted. The current path of the charge transfer transistor Tij, i.e., a drain-source channel, is connected between a first electrode of the ferroelectric capacitor Cij and a corresponding bit line BLj. The gate of each of the transistors Tij is connected to a corresponding word line WLi. The second electrode of the capacitor Cij is connected to a corresponding plate line PLi. For example, the current path of the charge transfer transistor T11 is connected between the first electrode of the ferroelectric capacitor C11 and the bit line BL1 and the gate thereof is connected to the word line WL1. The second electrode of the ferroelectric capacitor C11 is connected to the plate line PL1.

The word lines WL1~WLm are connected to the row decoder circuit 20. The plate lines PL1~PLm are connected to the pulse generation circuit 30. When a word line is selected, the pulse generation circuit 30 supplies a pulse signal to the plate line corresponding to the selected word line such that the polarization domains of the ferroelectric material are polarized in a predetermined direction.

The bit lines BL1~BLn are connected to the latch sense circuit 40 and to the column selection circuit 80. The latch sense circuit 40 is connected to two sense drive lines SAP and SAN provided by the sense drive level generation circuit 50 and n number of reference level supply lines REF1~REFn from the reference level generation circuit 60. The latch sense circuit 40 is comprised of n number of latch sense amplifiers.

Each latch sense amplifier is comprised of two CMOS circuits, each of which comprises PMOS and NMOS transistors, as shown in FIG. 3. In the first CMOS circuit, the current paths of transistors P1 and N1 are connected in series between the sense drive lines SAP and SAN and the gates thereof are commonly connected to a corresponding reference level supply line REFj, where j is an integer between 1 and n. In the second CMOS circuit, the current paths of transistors P2 and N2 are also connected in series between the sense drive lines SAP and SAN and the gates thereof are commonly connected to a corresponding bit line BLj, where j is an integer between 1 and n. The sense drive lines SAP and SAN are complementary sense drive signals generated by the sense drive level generation circuit 50. The high level of each sense drive signal SAP and SAN is a voltage level Vk and the low level thereof is a ground voltage level Vss.

The column selection circuit 80 is comprised of n number of NMOS transistors (not shown) as selection transistors. The channels or current paths of the selection transistors are connected between a corresponding bit line BLj and a corresponding data line DLy, where y is an integer between 1 and k. The respective selection transistors are turned on/off in response to respective column selection signals Y1~Yn generated by the column decoder circuit 70. The main sense and write drive circuit 90 and data input/output circuit 10 are well-known in the art and are not described in further detail.

FIG. 4 is a graph showing the I-V hysteresis switching loop of the ferroelectric capacitor according to the first embodiment of the present invention. In this graph, the abscissa indicates the potential difference between the electrodes of the ferroelectric capacitor, i.e., the voltage between both ends of the capacitor. The ordinate in the graph indicates the amount of charge induced in the surface of ferroelectric material in accordance with spontaneous polarization, i.e., the degree of polarization in micro coulombs per centimeter squared ($\mu C/cm^2$).

As shown in FIG. 4, if no electric field and no voltage is applied to the ferroelectric material no polarization exists. Even though the voltage is increased up to the voltage level Vk at point "A'" in the positive direction of the graph, the degree of polarization remains at zero ($Q_0$). If the voltage is again lowered to zero volts, the degree of polarization moves to point "B'". Next, if the applied voltage is increased in a negative direction of the graph to the voltage level –Vcc, the degree of polarization is changed from point "B'" to point "C". After this, even though the voltage is lowered again to zero voltage, the degree of polarization is not reduced to zero volts, but remains at point "D". Then, if the applied voltage is increased once more to the voltage level Vk in the positive direction, the degree of polarization is changed from point "D" to point "A'". Thereafter, if the applied voltage is lowered again to zero volts, the degree of polarization returns to point "B'".

In this embodiment, logic "1" data corresponds to point "B'" of the hysteresis loop of the ferroelectric capacitor and logic "0" data corresponds to the point "D".

Write Operation

Referring to FIG. 5, at the initial stage of a write cycle, a precharge voltage having a Vss level or zero voltage level is applied from the bit line precharge circuit (not shown) to the bit line BLj. For the sake of description clarity, we assume that the voltage from the bit line to the ferroelectric capacitor is a positive (+) voltage and the voltage from the plate line to the ferroelectric capacitor is a negative (–) voltage.

When the word line WLi is selected, a data sensing operation for data stored in the memory cell is carried out. Between the time interval t0~t1, a Vcc level pulse signal, which allows the ferroelectric material of each capacitor Ci1~Cin corresponding to the selected word line WLi to polarize, is applied to each capacitor Cij via the plate line PLi. The application of the Vcc level pulse signal results in the positive charge polarization domain of the polarized ferroelectric material to be arranged toward the bit line BLj and the negative charge polarization domain thereof is arranged toward the plate line PLi. If logic "0" data is stored in the memory cell MCij, as shown in FIG. 4, the degree of polarization of the ferroelectric capacitor Cij moves from point "D" to point "C" and back to point "D", so that no charge is transmitted from the ferroelectric capacitor to the bit line BLj. Consequently, if logic "0" data is stored in the memory cell, the voltage on the bit line BLj is equal to the precharge voltage (i.e., Vss voltage) during the sensing operation. Conversely, if logic "1" data is stored in the memory cell, the degree of polarization of the ferroelectric capacitor Cij moves from point "B'" to point "D" via point "C", so that an amount of charge dQ1 is transmitted from the ferroelectric capacitor to the bit line BLj. Therefore, if logic "1" data is stored in the memory cell, the voltage on the bit line BLj is increased to more than the precharge voltage Vss, i.e., it is equal to $VSS+V_{dQ1}$, where $V_{dQ1}$ is the voltage caused by the charge differential dQ1. $V_{dQ1}$ is generally on the order of about 100 mV.

As described above, the bit line voltage change due to the polarization of the ferroelectric material is compared with a reference voltage that is set to some amount greater than the precharge voltage Vss during the time interval t1~t2. The reference voltage is generally set to 50 mV above the precharge voltage Vss. If the bit line voltage change is thus less than the reference voltage, the precharge voltage level Vss is applied to the ferroelectric capacitor Cij. If the bit line voltage change is thus more than the reference voltage, a voltage having a level Vk, (referring to FIG. 4) which is more than the reference voltage, is applied to the capacitor Cij with its polarity unchanged.

Subsequently, an actual write operation is carried out during the time interval t2~t5. During this time, the data inputted through the data input/output circuit 100 having a ground voltage Vss level or a power supply Vcc level is applied to each data input/output line DI00~DI0k. At the same time, if the column selection circuit 80 is driven by the column selection lines Y1~Yn from the column decoder circuit 70, the data on the data input/output lines DI00~DI0k are delivered to the selected bit lines via the write drive circuit 90. In case that logic "0" data is written in the memory cell by means of the latch sense circuit 40, the ground voltage Vss is applied to the selected bit line. In case that logic "1" data is written in the memory cell, the Vk voltage is applied to the selected bit line. Therefore, during the interval t2~t3, when logic "1" data is stored, the degree of polarization of the ferroelectrc capacitor is positioned at point "A'". Conversely, when logic "0" data is stored, the degree of polarization thereof is positioned at point "D".

During the write cycle, however, data is not always written to all the memory cells MCi1~MCin related to one selected word line. In other words, data may be frequently stored only in memory cells which are selected by several bit lines.

During the time interval t0~t1, when a pulse signal having a negative voltage is applied to the capacitor Cij, the degree of polarization of the capacitor Cij, which stores logic "0" data is positioned at point "B'". However, the degree of polarization of the capacitor Cij which stores logic "1" data moves from point "B'" to point "D". This operation is carried out even by non-selected memory cells related to the one selected word line. As a result, a rewrite operation is required to restore the data of the non-selected capacitor. To perform the rewrite operation, a pulse signal having a power supply Vcc level is applied once more to the non-selected capacitors via the plate lines during the time interval t3~t4.

After the time t5, when logic "1" data is written, the degree of polarization of the capacitor is positioned at the point "B'" and when logic "0" data is written, the degree of polarization is positioned at the point "D". As a result, the data write cycle is completed.

Read Operation

Figure 6:
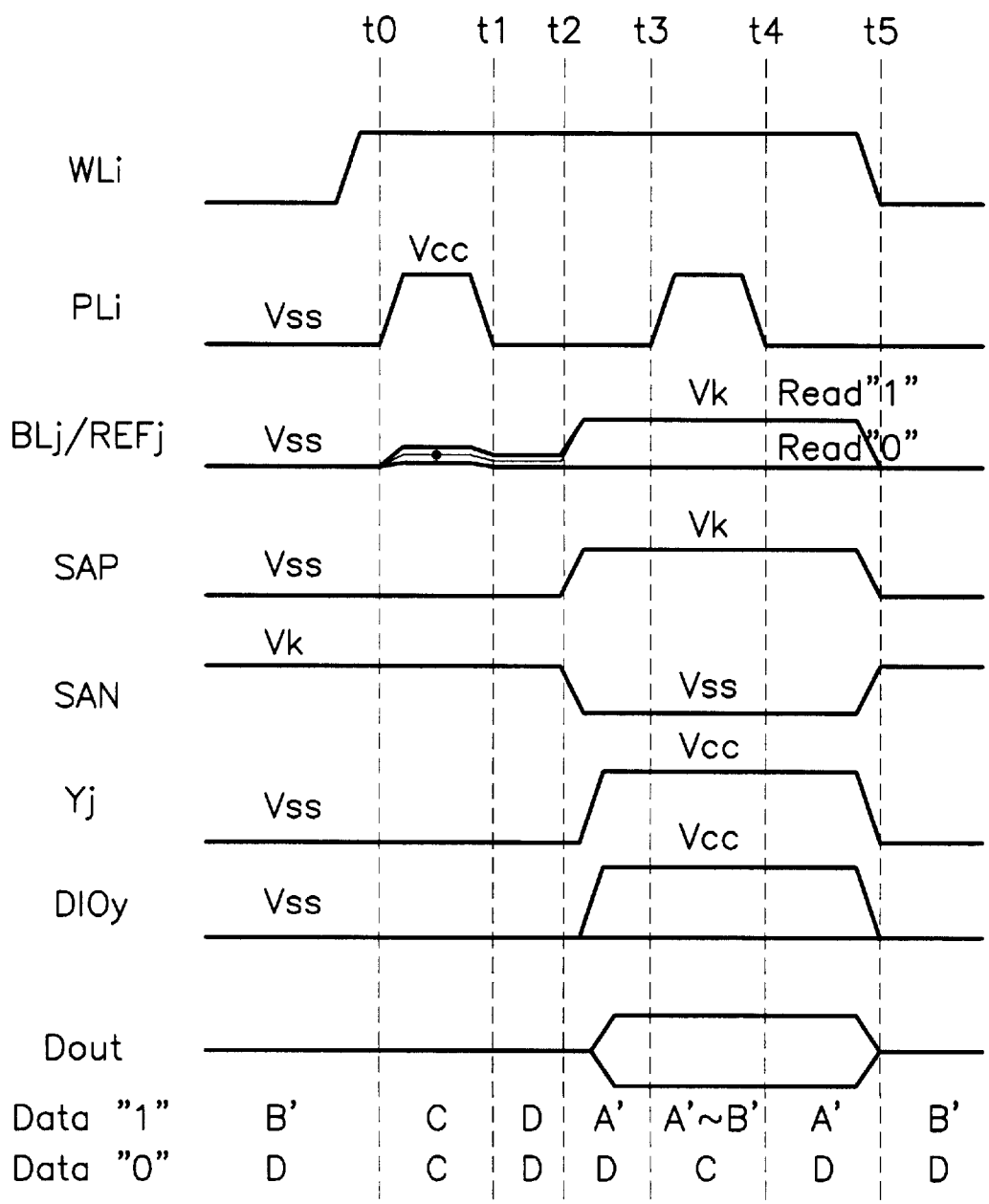
FIG. 6 is a timing diagram of the read operation of the FRAM shown in FIG. 3 having the first hysteresis characteristic shown in FIG. 4.

Referring to FIG. 6, a precharge voltage having a ground voltage level Vss or zero volts is applied to the bit line BLj and a negative pulse signal which allows the ferroelectric material of each capacitor Ci1~Cin corresponding to the selected word line WLi to be polarized is applied to each capacitor Cij via the plate line PLi during the time interval of t0~t1.

Next, the bit line voltage (e.g., about 100 mV) change due to the polarization of the ferroelectric material is compared with the reference voltage (e.g., 50 mV) of more than the precharge voltage Vss during the interval t1~t2. If the bit line voltage change is less than the reference voltage or if logic "0" data is stored, each bit line is developed to the Vss voltage by means of the latch sense circuit 40. If the bit line voltage change is more than the reference voltage or if logic "1" data is stored, each bit line is developed to the voltage level Vk. The voltages on the bit lines are delivered to the main sense circuit 90 via the column selection circuit 80. The main sense circuit 90 amplifies the voltage level Vk to the voltage level Vcc. The amplified data is provided through the data input/output circuit 100 to external circuitry.

Similarly to the above described write cycle, data is not always read from all the memory cells MCi1~MCin related to the one selected word line during the read cycle. In other words, data may be frequently read from only a few memory cells selected by several bit lines.

During the interval t0~t1, when a negative polarity pulse is applied to the capacitor Cij, the degree of polarization of the capacitor Cij which stores logic "0" data is positioned at point "B'", but the degree of polarization of the capacitor Cij which stores logic "1" data moves from point "B'" to point "D". This operation is carried out even by non-selected memory cells related to the one selected word line. As a result, a write operation is required to restore the data of the non-selected capacitor. To perform the rewrite operation, a pulse signal having the power supply voltage level Vcc is applied once more to the non-selected capacitor via the plate lines during the interval t3~t4.

In this embodiment, it is illustrated that logic "1" data corresponds to point "B'" of the hysteresis loop of the ferroelectric capacitor and logic "0" data corresponds to point "D", as shown in FIG. 4. However, it can be understood that logic "0" data may correspond to point "B'" and logic "1" data may correspond to point "D" by modifying the sensing scheme.

Second Embodiment

The FRAM of the second embodiment has a similar construction to that of the first embodiment. The FRAM of the second embodiment further comprises a pulse generation circuit 30 for generating a pulse signal having a voltage level Vk and a sense drive level generation circuit 50 for generating sense drive signals having Vcc and Vss voltage levels.

In the second embodiment, binary data corresponds only to the positive charge polarization domain of hysteresis graph of the ferroelectric capacitor dissimilarly to the first embodiment. Thus, during the write/read operation of the FRAM according to the second embodiment, a voltage having e.g., a negative voltage level -Vk which allows the polarity of the charge polarization of the ferroelectric capacitor to remain the same is applied from the bit line BLj to the ferroelectric capacitor.

As stated above, since the binary data is stored only in the positive charge polarization domain in the hysteresis graph, no domain switching is caused. As a result, the endurance of the FRAM is considerably improved. Additionally, in the FRAM of the second embodiment, there is no need for providing a pumped voltage signal to the word line WLi. Therefore power consumption is reduced.

Figure 7:
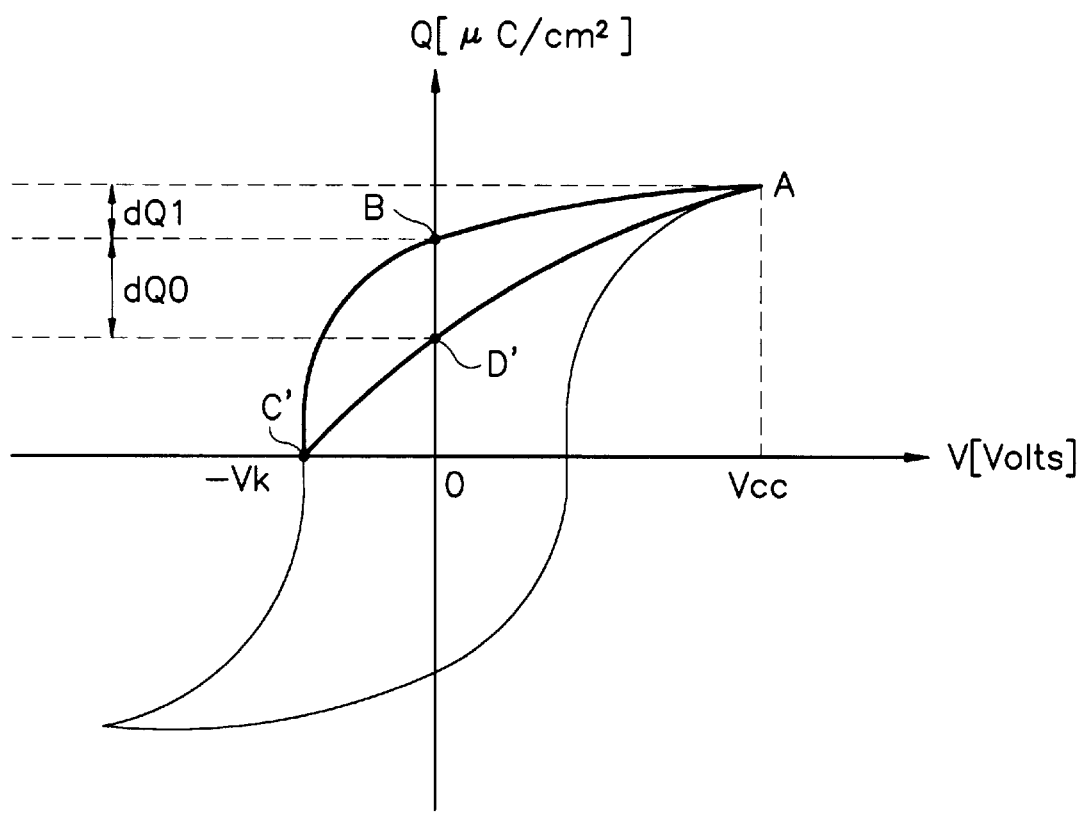
FIG. 7 is a graph of the second hysteresis characteristic of the FRAM shown in FIG. 3.

FIG. 7 is a graph for explaining the second hysteresis I-V switching loop for the FRAM shown in FIG. 3. In this graph, the abscissa indicates the potential difference between the electrodes of the ferroelectric capacitor. The ordinate indicates the amount of charge induced in the surface of ferroelectric material in accordance with spontaneous polarization, i.e., degree of polarization in micro coulombs per centimeter squared ($\mu C/cm^2$).

As shown in FIG. 7, if no electric field and zero volts is applied to the ferroelectric material no polarization exists. When the voltage is increased in a positive direction of the graph, the degree of polarization is increased from zero up to point "A" inside the positive charge polarization domain. At point "A", all the domains are polarized in one direction and the degree of polarization is maximized. The magnitude of the applied voltage is the operation power supply voltage Vcc. Thereafter, even though the voltage is lowered again to zero volts, the degree of polarization is not reduced to zero but returns to point "B".

Next, if the voltage is increased in the negative direction of the graph, the degree of polarization is changed from point "B" to point "C'". Thereafter, even if the voltage is lowered again to zero volts, the degree of polarization is not reduced to zero but moves to point "D'". If the voltage is increased once more up to the voltage level Vcc in the positive direction, the degree of polarization is changed from point "D'" to point "A".

In the second embodiment, logic "1" data corresponds to point "B" of the hysteresis loop of the ferroelectric capacitor and logic "0" data corresponds to point "D'", as shown in FIG. 7.

Write Operation

Figure 8:
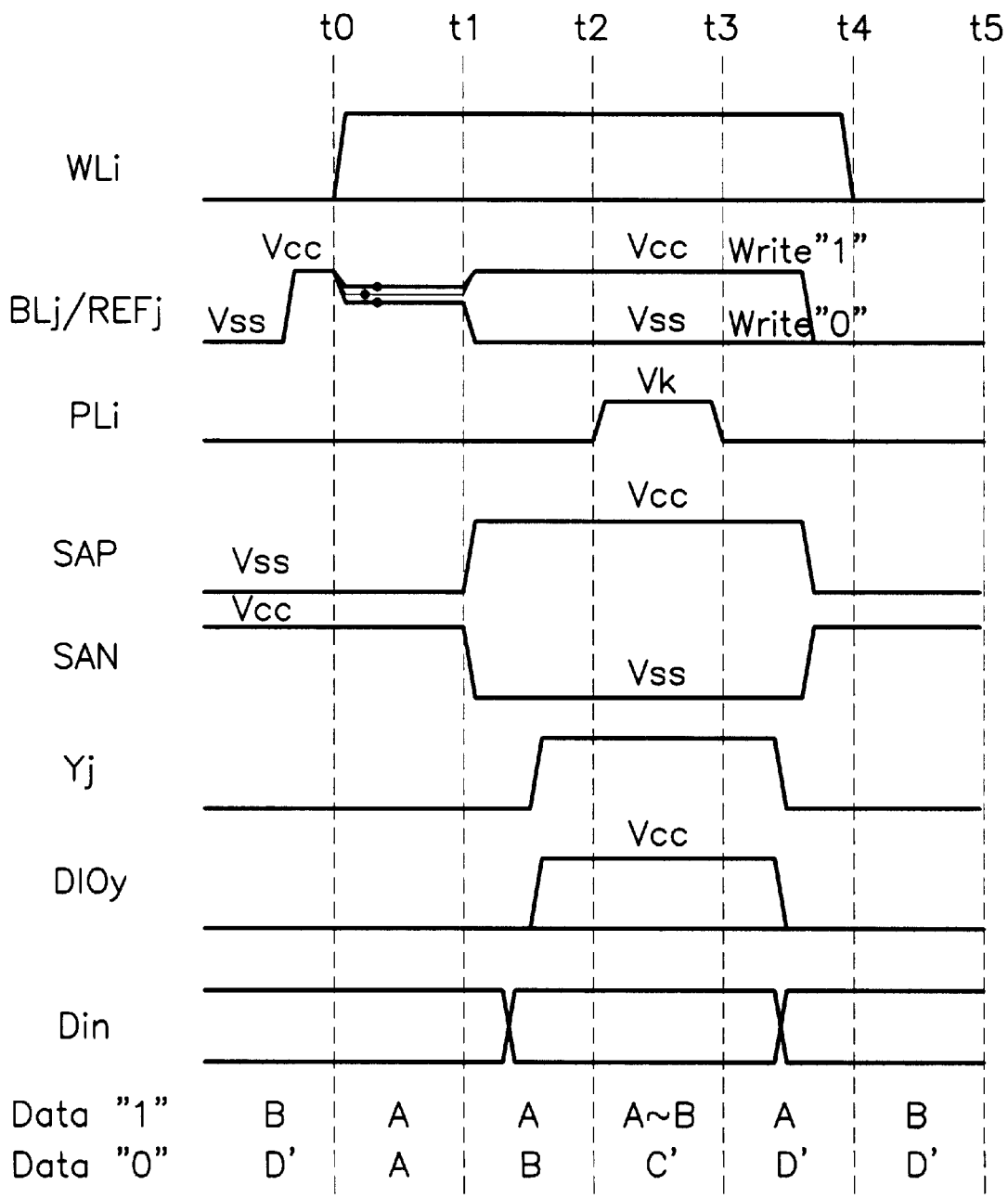
FIG. 8 is a timing diagram of the write operation of the FRAM shown in FIG. 3 having the second hysteresis characteristic shown in FIG. 7.

FIG. 8 is a timing diagram showing the write operation of the FRAM to which the switching loop of FIG. 7 is implemented. Referring to FIG. 8, at the initial stage of a write cycle, a precharge voltage having a Vss level or zero voltage level is applied from the bit line precharge circuit (not shown) to the bit line BLj. When the word line WLi is selected, a data sensing operation for data stored in the memory cell is carried out during the interval t0~t1. Then, a voltage pulse signal having a power supply Vcc level, which allows the ferroelectric material of each capacitor Ci1~Cin corresponding to the selected word line WLi to polarize, is applied to each capacitor Cij via each plate.

The bit line voltage change due to the polarization of the ferroelectric material is compared with a reference voltage by means of the latch sense circuit 40 during the interval t1~t2. If the bit line voltage change is less than the reference voltage, a voltage having a Vss level is applied to the ferroelectric capacitor Cij by the latch sense circuit 40. If the bit line voltage change is more than the reference voltage, a voltage having a Vcc level is applied to the ferroelectric capacitor Cij.

Next, an actual write operation is carried out during the interval t2~t5. During the write interval, the data inputted through the data input/output circuit 100 having either a Vss or a Vcc voltage level is applied to each data input/output line DI00~DI0k. At the same time, if the column selection circuit 80 is driven by the column selection lines Y1~Yn from the column decoder circuit 70, the voltages on the data input/output lines DI00~DI0k are delivered to the selected bit lines via the write drive circuit 90. Therefore, when logic "0" data is written during t2~t3, the degree of polarization of the ferroelectric capacitor is positioned at point "D'". When logic "1" data is written, the degree of polarization thereof is positioned at point "B".

During the write cycle, however, data is not always written in all the memory cells MCi1~MCin related to the one selected word line. In other words, data may be frequently stored in only a few memory cells selected by several bit lines.

During the interval of t0~t1, when the data sensing operation is carried out, the degree of polarization of the capacitor Cij which stores logic "1" data is positioned at the point "B" but that of the capacitor Cij which stores logic "0" data moves from point "D'" to point "B". This operation is carried out even by the non-selected memory cells related to the one selected word line. As a result, a rewrite operation is required to restore the data of the non-selected memory cell capacitor. To perform the rewrite operation, a pulse signal having a voltage level Vk is applied once more to the non-selected capacitors via the plate lines during the interval t2—t3.

After the time t4, when logic "0" data is written, the degree of polarization of the capacitor is positioned at point "D'" and when logic "1" data is written, the degree of polarization is positioned at point "B". As a result, the data write cycle is completed.

Read Operation

Figure 9:
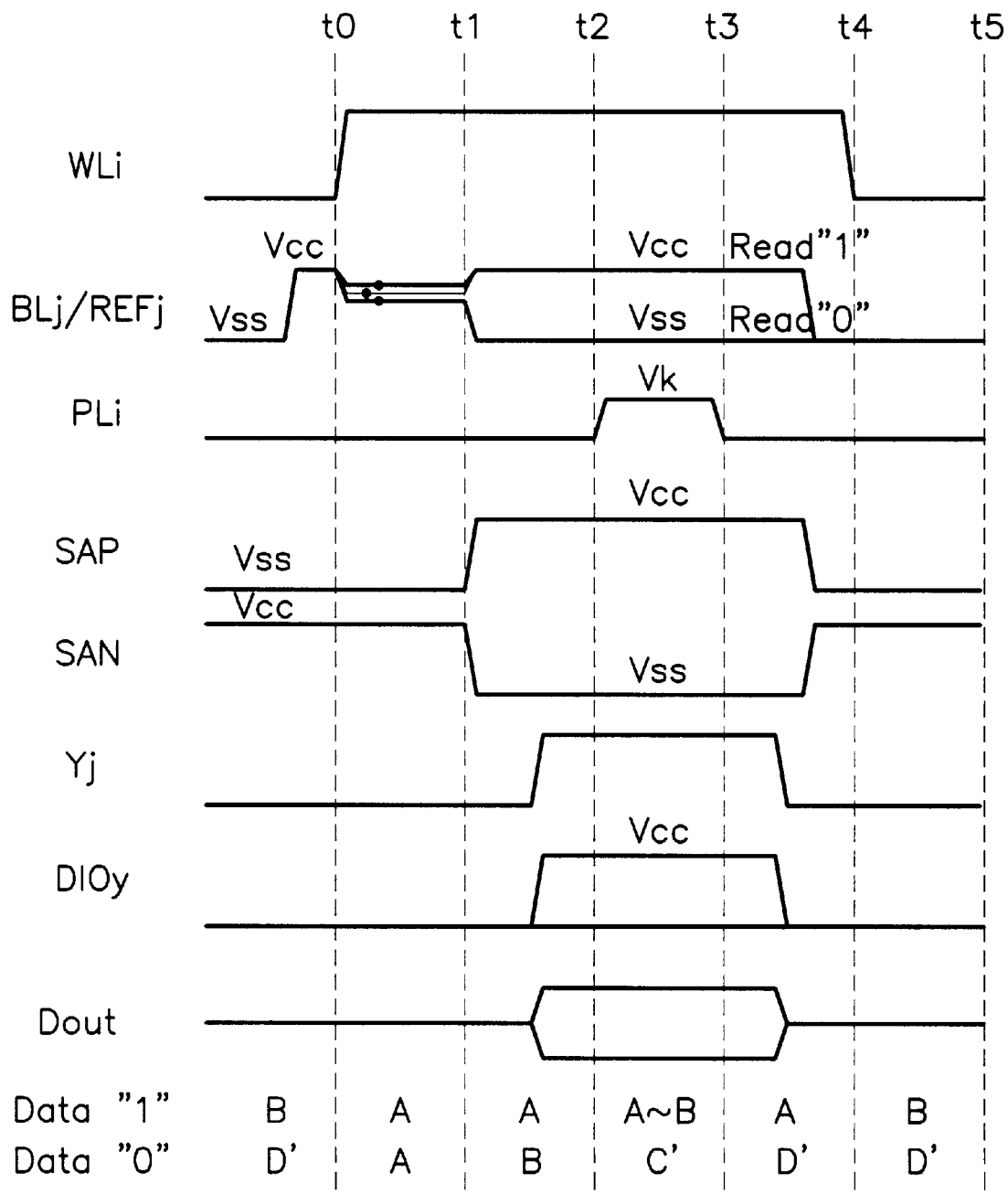
FIG. 9 is a timing diagram of the read operation of the FRAM shown in FIG. 3 having the second hysteresis characteristic shown in FIG. 7.

FIG. 9 is a timing diagram showing the read operation of the FRAM to which the switching loop of FIG. 7 is implemented. Referring to FIG. 9, similarly to the timing diagram of FIG. 8, a precharge voltage having a power supply voltage level Vcc is applied to the bit line BLj so that each capacitor Ci1~Cin corresponding to the selected word line WLi is completely polarized. The negative charge polarization domain of the polarized ferroelectric material is arranged toward the bit line BLj and the positive charge polarization domain thereof is arranged toward the plate line PLi. If logic "0" data is stored in the memory cell MCij, as shown in FIG. 7, the degree of polarization of the ferroelectric capacitor Cij moves from point "B" to point "A" and returns to point "B", so that an amount of charge dQ1 is transmitted from the bit line BLj to the ferroelectric capacitor. The potential of the bit line is therefore somewhat lowered. Conversely, if logic "0" data is stored in the memory cell, the degree of polarization of the ferroelectric capacitor Cij moves from point "D'" to point "B" via point "A", so that an amount of charge dQ1 is transmitted from the bit line BLi to the ferroelectric capacitor. Therefore, if logic "0" data is stored in the memory cell, the voltage on the bit line BLi is lowered to less than the precharge voltage Vcc, i.e., the voltage on the bit line equals Vcc–$V_{dQ0}$, where $V_{dQ0}$ is the voltage caused by the charge differential dQ0.

Next, the bit line voltage is compared with a reference voltage during the interval t1~t2. If the bit line voltage change is less than the reference voltage, a ground voltage is applied to the ferroelectric capacitor Cij. If the bit line voltage is more than the reference voltage, a voltage having a power supply voltage level Vcc is applied to the capacitor Cij.

Subsequently, to perform the rewrite operation, a signal pulse having a voltage level Vk which allows the polarity of the capacitor to remain the same is applied to the plate line corresponding to the selected word line. Therefore, the read operation is completed.

In the second embodiment, it is illustrated that logic "1" data corresponds to point "B" of the hysteresis loop of the ferroelectric capacitor and logic "0" data corresponds to point "D'", as shown in FIG. 7. However, it can be understood that logic "0" data may correspond to point "B" and logic "1" data may correspond to point "D'" by modifying the sensing scheme.

As described above, according to the present invention, since the binary data is stored in a single charge polarization domain in the hysteresis graph of the ferroelectric capacitive memory cell, no domain switching exists. Therefore, the endurance of FRAM is considerably improved.

Additionally, the FRAM of the present invention does not require supplying the word lines with a pumped or increased voltage signal thus reducing overall power consumption.

What is claimed is:

1. A ferroelectric random access memory device comprising:

a substrate defined by a plurality of rows and columns;

a plurality of word lines extending along the plurality of rows;

a plurality of plate lines extending along the plurality of rows;

a plurality of bit lines extending along the plurality of columns;

a memory cell array having a plurality of memory cells arranged in a matrix form, each memory cell including a switch having a first, a second, and a control terminal and a capacitor having a first and a second electrode and a ferroelectric material inserted between the first and second electrodes, the first terminal of the switch being connected to a corresponding bit line of the plurality of bit lines, the second terminal of the switch being connected to the first electrode of the capacitor, the control terminal of the switch being connected to a corresponding word line of the plurality of word lines, and the second electrode of the capacitor being connected to a corresponding plate line of the plurality of plate lines;

means for precharging each of the plurality of bit lines to a predetermined precharge voltage level;

means for generating a voltage pulse signal having a first voltage level, the voltage pulse signal being applied to at least one plate line of the plurality of plate lines corresponding to a selected word line of the plurality of word lines thereby polarizing the ferroelectric material in a predetermined direction;

means for generating a reference signal having a second voltage level;

means for generating a first and a second complementary drive signals; and means for comparing the reference signal to a voltage on a bit line corresponding to the selected word line and for applying the first or second complementary drive signals to the capacitor responsive to the comparison.

2. The ferroelectric random access memory device of claim 1 wherein the first complementary drive signal has a third voltage level when the second complementary drive signal has a fourth voltage level and vice versa.

3. The ferroelectric random access memory device of claim 1 wherein the first complementary drive signal is applied to the capacitor when the voltage on the bit line is greater than the reference voltage.

4. The ferroelectric random access memory device of claim 3 wherein the second complementary drive signal is applied to the capacitor when the voltage on the bit line is less than the reference voltage.

5. A ferroelectric random access memory device, comprising:

a plurality of word lines extending in a first direction;

a plurality of bit lines extending in a second direction perpendicular to the first direction;

a plurality of memory cells arranged at respective crossings between the plurality of word and bit lines, each of the memory cells having a ferroelectric capacitor for storing binary data;

means for precharging each of the bit lines to a precharge voltage level;

means for supplying a voltage pulse signal having a first voltage level to the ferroelectric capacitor corresponding to a selected memory cell of the plurality of memory cells thereby polarizing the ferroelectric capacitor in a predetermined direction and generating a bit line voltage on a bit line corresponding to the selected memory cell;

means for generating a first and a second complementary drive signals, the first complementary drive signal having a second voltage level when the second complementary drive signal has a third voltage level; and means for comparing the bit line voltage with a reference voltage and providing the capacitor corresponding to the selected memory cell with either the first or the second complementary drive signals responsive to the comparison;

wherein the ferroelectric capacitor does not change polarity with voltage changes of the bit line corresponding to the selected memory cell.

6. The ferroelectric random access memory device of claim 5 wherein the binary data is stored only in a positive charge polarization domain of the ferroelectric capacitor.

7. The ferroelectric random access memory device of claim 5 wherein the binary data is stored only in a negative charge polarization domain of the ferroelectric capacitor.

8. A method for reading or writing a binary data signal from or into a memory cell, respectively, the memory cell including a ferroelectric capacitor and a switch, the ferroelectric capacitor having a first and a second electrode and a ferroelectric material inserted between the first and the second electrodes, the first electrode for receiving a plate line, and the switch having a first, a second, and a control terminal, the control terminal for receiving a word line, the first terminal for receiving a bit line, and the second terminal for connecting to the second electrode of the capacitor, the method comprising:

selecting the memory cell;

applying a precharge voltage to the bit line;

applying a first voltage pulse to the plate line when the word line is selected thereby polarizing the capacitor;

comparing a bit line voltage with a reference voltage;

applying a drive voltage to the capacitor responsive to the comparison; and applying a second voltage pulse to the plate line.

9. The method of claim 8 wherein applying a drive voltage to the capacitor includes:

applying a ground voltage to the capacitor if the bit line voltage is less than the reference voltage; and applying a drive voltage having a first voltage level to the capacitor if the bit line voltage is greater than the reference voltage.

10. The method of claim 9 wherein the first voltage level set to allow the ferroelectric material to have a zero degree polarization.

* * * * *